US006870276B1

(12) United States Patent
Moxham et al.

(10) Patent No.: US 6,870,276 B1
(45) Date of Patent: *Mar. 22, 2005

(54) APPARATUS FOR SUPPORTING MICROELECTRONIC SUBSTRATES

(75) Inventors: Stephen Moxham, Boise, ID (US); William Stephenson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/034,924

(22) Filed: Dec. 26, 2001

(51) Int. Cl.⁷ .................... H01L 23/48; H01L 23/52; H01L 29/40

(52) U.S. Cl. .................. 257/784; 257/786; 257/666; 257/698; 257/690; 257/691; 257/692; 257/693; 257/696; 257/697

(58) Field of Search .................. 257/784, 786, 257/666, 668, 696–698, 690–693, 617

(56) References Cited

U.S. PATENT DOCUMENTS

| | | |
|---|---|---|
| 5,062,565 A | 11/1991 | Wood et al. |
| 5,128,831 A | 7/1992 | Fox, III et al. |
| 5,145,099 A | 9/1992 | Wood et al. |
| 5,255,156 A | 10/1993 | Chang |
| 5,286,679 A | 2/1994 | Farnworth et al. |
| 5,444,303 A | 8/1995 | Greenwood et al. |
| 5,504,373 A | 4/1996 | Oh et al. |
| 5,544,124 A | 8/1996 | Zagar et al. |
| 5,593,927 A | 1/1997 | Farnworth et al. |
| 5,642,262 A | 6/1997 | Terrill et al. |
| 5,656,863 A | 8/1997 | Yasunaga et al. |
| 5,677,566 A | 10/1997 | King et al. |

(List continued on next page.)

FOREIGN PATENT DOCUMENTS

| | | |
|---|---|---|
| DE | 196 00 401 A1 | 7/1997 |
| DE | 197 14 470 A1 | 12/1997 |
| EP | 0 398 628 A2 A3 | 11/1990 |
| EP | 0 413 451 A2 A3 | 2/1991 |
| EP | 0 853 337 A1 | 7/1998 |
| WO | WO 92/17901 A1 | 10/1992 |

OTHER PUBLICATIONS

Van Zant, Peter, "Microchip Fabrication: A Practical Guide to Semiconductor Processing," p. 545, McGraw–Hill, New York, Third Edition, Oct. 1996, ISBN: 0070672504.

Harper, Charles A. and Miller, Martin B., "Electronic Packaging, Microelectronics, and Interconnection Dictionary," p. 211, McGraw–Hill, New York, Feb. 1993, ISBN: 0070266883.

(List continued on next page.)

*Primary Examiner*—Alexander Oscar Williams
(74) *Attorney, Agent, or Firm*—Perkins Coie LLP

(57) ABSTRACT

A method and apparatus for supporting a microelectronic substrate. The apparatus can include a microelectronic substrate and a support member carrying the microelectronic substrate. The apparatus can further include a first connection structure carried by the support member. The first connection structure can have a first bond site configured to receive a flowable conductive material, and can further have at least two first elongated members connected and extending outwardly from the first bond site. Each first elongated member can be configured to receive at least a portion of the flowable conductive material from the first bond site, with none of the first elongated members being electrically coupled to the microelectronic substrate. The assembly can further include a second connection structure that is electrically coupled to the microelectronic substrate and that can include second elongated members extending away from a second bond site. The number of second elongated members can be equal to the number of first elongated members.

61 Claims, 12 Drawing Sheets

U.S. PATENT DOCUMENTS

| | | | |
|---|---|---|---|
| 5,723,906 | A | 3/1998 | Rush |
| 5,734,559 | A | 3/1998 | Banerjee et al. |
| 5,826,628 | A | 10/1998 | Hamilton |
| 5,843,799 | A | 12/1998 | Hsu et al. |
| 5,879,965 | A | 3/1999 | Jiang et al. |
| 5,891,797 | A | 4/1999 | Farrar |
| 5,936,844 | A | 8/1999 | Walton |
| 5,946,314 | A | 8/1999 | Licciardi et al. |
| 5,946,553 | A | 8/1999 | Wood et al. |
| 5,986,209 | A | 11/1999 | Tandy |
| 5,990,566 | A | 11/1999 | Farnworth et al. |
| RE36,469 | E | 12/1999 | Wood et al. |
| 6,018,249 | A | 1/2000 | Akram et al. |
| 6,020,624 | A | 2/2000 | Wood et al. |
| 6,025,728 | A | 2/2000 | Hembree et al. |
| 6,048,744 | A | 4/2000 | Corisis et al. |
| 6,048,755 | A | 4/2000 | Jiang et al. |
| 6,072,233 | A | 6/2000 | Corisis et al. |
| 6,089,920 | A | 7/2000 | Farnworth et al. |
| 6,097,087 | A | 8/2000 | Farnworth et al. |
| 6,103,547 | A | 8/2000 | Corisis et al. |
| 6,107,122 | A | 8/2000 | Wood et al. |
| 6,108,210 | A | 8/2000 | Chung |
| 6,111,205 | A | 8/2000 | Leddige et al. |
| 6,118,179 | A | 9/2000 | Farnworth et al. |
| 6,130,474 | A | 10/2000 | Corisis |
| 6,133,068 | A | 10/2000 | Kinsman |
| 6,133,622 | A | 10/2000 | Corisis et al. |
| 6,148,509 | A | 11/2000 | Schoenfeld et al. |
| 6,150,710 | A | 11/2000 | Corisis |
| 6,150,717 | A | 11/2000 | Wood et al. |
| 6,153,924 | A | 11/2000 | Kinsman |
| 6,159,764 | A | 12/2000 | Kinsman et al. |
| 6,180,504 | B1 | 1/2001 | Farnworth et al. |
| 6,188,232 | B1 | 2/2001 | Akram et al. |
| 6,201,304 | B1 | 3/2001 | Moden |
| 6,201,305 | B1 * | 3/2001 | Darveaux et al. ........... 257/779 |
| 6,214,716 | B1 | 4/2001 | Akram |
| 6,225,689 | B1 | 5/2001 | Moden et al. |
| 6,228,548 | B1 | 5/2001 | King et al. |
| 6,229,202 | B1 | 5/2001 | Corisis |
| 6,232,147 | B1 | 5/2001 | Matsuki et al. |
| 6,232,666 | B1 | 5/2001 | Corisis et al. |
| 6,239,489 | B1 | 5/2001 | Jiang |
| 6,246,108 | B1 | 6/2001 | Corisis et al. |
| 6,246,110 | B1 | 6/2001 | Kinsman et al. |
| 6,247,629 | B1 | 6/2001 | Jacobson et al. |
| 6,258,623 | B1 | 7/2001 | Moden et al. |
| 6,258,624 | B1 | 7/2001 | Corisis |
| 6,259,153 | B1 | 7/2001 | Corisis |
| 6,261,865 | B1 | 7/2001 | Akram |
| 6,265,766 | B1 | 7/2001 | Moden |
| 6,271,580 | B1 | 8/2001 | Corisis |
| 6,281,042 | B1 | 8/2001 | Ahn et al. |
| 6,284,571 | B1 | 9/2001 | Corisis et al. |
| 6,285,204 | B1 | 9/2001 | Farnworth |
| 6,291,894 | B1 | 9/2001 | Farnworth et al. |
| 6,297,547 | B1 | 10/2001 | Akram |
| 6,303,981 | B1 | 10/2001 | Moden |
| 6,303,985 | B1 | 10/2001 | Larson et al. |
| 6,310,390 | B1 | 10/2001 | Moden |
| 6,326,698 | B1 | 12/2001 | Akram |
| 6,329,222 | B1 | 12/2001 | Corisis et al. |
| 6,329,705 | B1 | 12/2001 | Ahmad |
| 6,331,221 | B1 | 12/2001 | Cobbley |
| 6,331,448 | B1 | 12/2001 | Ahmad |
| 6,344,976 | B1 | 2/2002 | Schoenfeld et al. |
| 6,410,990 | B2 * | 6/2002 | Taylor et al. ............... 257/786 |
| 6,429,528 | B1 | 8/2002 | King et al. |
| 6,477,046 | B1 * | 11/2002 | Stearns et al. .............. 361/704 |
| 2002/0195345 | A1 * | 12/2002 | Bentsen et al. ............. 204/600 |
| 2002/0195614 | A1 * | 12/2002 | Tay et al. ................... 257/178 |
| 2003/0030965 | A1 * | 2/2003 | Chua et al. .............. 361/306.3 |

OTHER PUBLICATIONS

Kohl, James E. et al., "Low Cost Chip Scale Packaging and Interconnect Technology," 7 pages, Proceedings of the Surface Mount International Conference, San Jose, California, Sep. 1997, <http://www.epic-tech.com/smtppr.pdf>.

Kohl, James E. et al., "EPIC CSP™ Assembly and Reliability Methods," 5 pages, Proceedings of CS198, Santa Clara, California, May 1998, <http://www.epic-tech.com/cspi982.pdf>.

Singer, Adam T. et al., "Cost Considerations for CSP Variations," 9 pages, presented at Chip Scale International, San Jose, California, May 1998, <http://www.epic-tech.com/ibis_papr.pdf>.

Tessier, Theodore G. et al., "Technologies and Trends in Wafer Level Packaging," 15 pages, Future Fab International, vol. 11, Jun. 29, 2001, <http://www.future-fab.com/documents.asp?d_ID=660>.

U.S. patent application Ser. No. 09/811,179, Corisis, filed Mar. 16, 2001.

U.S. patent application Ser. No. 10/023,036, Corisis, filed Dec. 10, 2001.

Lau, John H., "Ball Grid Array Technology," McGraw-Hill, Inc., Chapter 8, "Reliability of Ceramic Ball Grid Array Assembly," pp. 224–265.

* cited by examiner

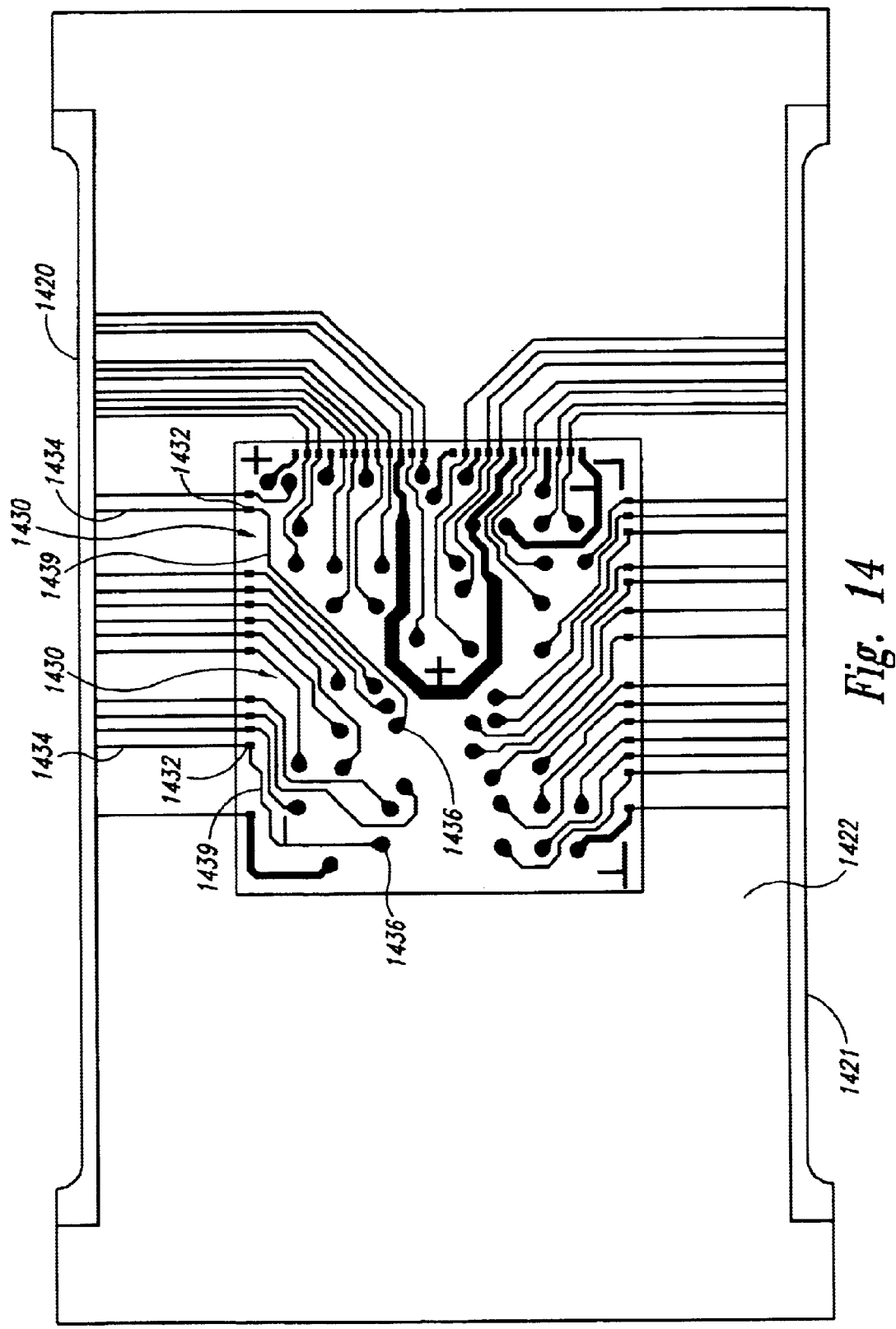

APPARATUS FOR SUPPORTING MICROELECTRONIC SUBSTRATES

BACKGROUND

The present invention is directed toward methods and apparatuses for supporting microelectronic substrates. Conventional microelectronic device packages typically include a microelectronic substrate mounted on a support member and packaged with an encapsulant. In one conventional arrangement shown in FIG. 1, a microelectronic device package 10 can include a support member 20 having a front surface 21 and a rear surface 22 facing opposite the front surface 21. The support member 20 can also have a slot 23 extending from the front surface 21 to the rear surface 22. A microelectronic substrate 40 (visible through the slot 23) is attached to the rear surface 22, and has wire bond pads 41 that are accessible through the slot 23 for coupling to the support member 20. Accordingly, the support member 20 can include active trace patterns 30, each of which has a wire bond pad 32, a ball bond pad 31, and a connecting trace 33 extending between the wire bond pad 32 and the ball bond pad 31. Each active trace pattern 30 can also include an electroplating trace 34 coupled to an electroplating bus 24 to provide electrically conductive coatings on the active trace pattern 30 during the formation of the support member 20.

In operation, the wire bond pads 32 of the active trace patterns 30 are connected to corresponding wire bond pads 41 of the microelectronic substrate 40 with wire bonds 42. A solder ball (not shown in FIG. 1) can then be disposed on each ball bond pad 31. The wire bonds 42 and the wire bond pads 41 and 32 can then be covered with an encapsulating material for protection, while the solder balls remain exposed. The exposed solder balls can be connected to other devices to provide for communication between those devices and the packaged microelectronic substrate 40.

In order to conform with industry standards, similar device packages 10 are often required to have the same number of solder balls, even if not all the solder balls are required to provide communication with the microelectronic substrate 40. Accordingly, the support member 20 can include inactive trace patterns 50. Each inactive trace pattern 50 can include a ball bond pad 51 that supports a solder ball, and an electroplating trace 54 for electroplating conductive coatings on the inactive trace pattern 50. The inactive trace patterns 50 do not include a wire bond pad 32 or a corresponding connecting trace 33. Accordingly, the inactive trace patterns 50 do not provide electrical communication to or from the microelectronic substrate 40. However, the inactive trace patterns 50 can support solder balls which, together with the solder balls on the active trace patterns 30, define a uniform pattern of solder balls that can be compatible with a variety of devices in which the package 10 is installed and/or tested.

FIG. 2 illustrates a conventional test apparatus 60 for testing device packages such as the package 10 described above with reference to FIG. 1. In one aspect of this arrangement, the test apparatus 60 can include a base 61 that supports the device package 10. An overlying frame 62 secures the package 10 to the base 61. When the package 10 is secured to the base 61, solder balls 25 of the package 10 remain exposed through an opening 65 in the frame 62. A test jig 63 is then aligned with the base 61 such that test contacts 64 of the jig 63 make physical and electrical contact with the solder balls 25 of the package 10. The test jig 63 is then used to test the operational characteristics of the device package 10.

One drawback with the foregoing arrangement is that the test jig 63 can partially or completely dislodge some of the solder balls 25 and/or the trace patterns to which the solder balls 25 are connected. The dislodged solder balls 25 and/or trace patterns can increase the incidence of short circuits in the package 10, and accordingly packages with these defects are typically discarded.

SUMMARY

The present invention is directed toward methods and apparatuses for supporting microelectronic substrates. An apparatus in according with one aspect of the invention includes a microelectronic substrate, a support member carrying the microelectronic substrate, and a connection structure carried by the support member. The connection structure can have a bond site configured to receive a flowable conductive material, such as solder, and the connection site can further have at least two elongated members connected to and extending outwardly from the bond site. Each elongated member can be configured to receive at least a portion of the flowable conductive material from the bond site, and none of the elongated members is electrically coupled to the microelectronic substrate.

In a further aspect of the invention, the connection structure can be a first connection structure and the elongated members can be first elongated members. The apparatus can include a second connection structure carried by the support member and having a second bond site configured to receive a flowable conductive material. The second connection structure can be electrically coupled to the microelectronic substrate and can have second elongated members extending outwardly from the second bond site, with each of the second elongated members configured to receive at least a portion of the flowable conductive material from the second bond site. The number of second elongated members for each second connection structure can equal the number of first elongated members for the first connection structure.

The invention is also directed to a method for coupling a flowable conductive material to a microelectronic substrate. The method can include aligning a support member to receive the flowable conductive material, with the support member having a support surface configured to carry a microelectronic substrate, and further having a first connection structure and second connection structure. The first connection structure can have a first bond site configured to receive the flowable conductive material and can be configured to remain decoupled from the microelectronic substrate when a support member carries the microelectronic substrate. The second connection structure can have a second bond site configured to receive the flowable conductive material, and can be configured to be electrically coupled to the microelectronic substrate when the support member carries the microelectronic substrate. The method can further include disposing a first quantity of the flowable conductive material on the first bond site, wicking a first portion of the first quantity of flowable material along first elongated members connected to and extending outwardly from the first bond site, and disposing a second quantity of the flowable conductive material on the second bond site. The method can further include wicking a second portion of the second quantity of flowable conductive material along second elongated members extending outwardly from the second bond site, with the second portion of the flowable conductive material having a volume approximately equal to a volume of the first portion. The first quantity of flowable conductive material can form a first conductive coupler, the second quantity can form a second conductive coupler, and each conductive coupler can project from the support member by approximately the same distance.

BRIEF DESCRIPTION OF THE DRAWINGS

FIG. 14 is a top plan view of a support member in accordance with another embodiment of the invention.

DETAILED DESCRIPTION

The present disclosure describes packaged microelectronic substrates and methods for forming such packages. The term "microelectronic substrate" is used throughout to include substrates upon which and/or in which microelectronic circuits or components, data storage elements or layers, and/or vias or conductive lines are or can be fabricated. Many specific details of certain embodiments of the invention are set forth in the following description and in FIGS. 3A–9 to provide a thorough understanding of these embodiments. One skilled in the art, however, will understand that the present invention may have additional embodiments, and that the invention may be practiced without several of the details described below.

Figure 1:
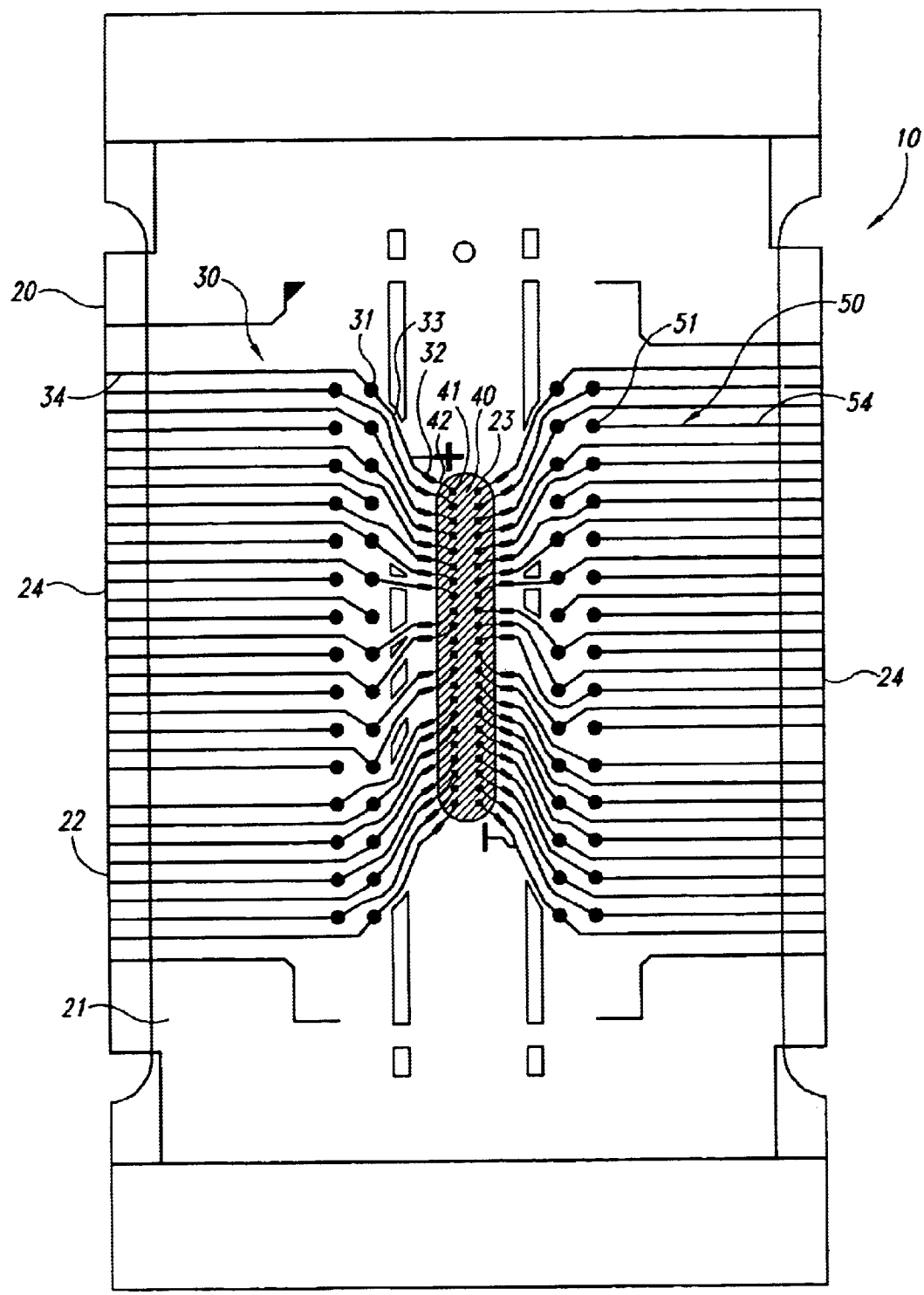
FIG. 1 is a bottom view of a microelectronic device package in accordance with the prior art, with selected features shown schematically.
Figure 2:
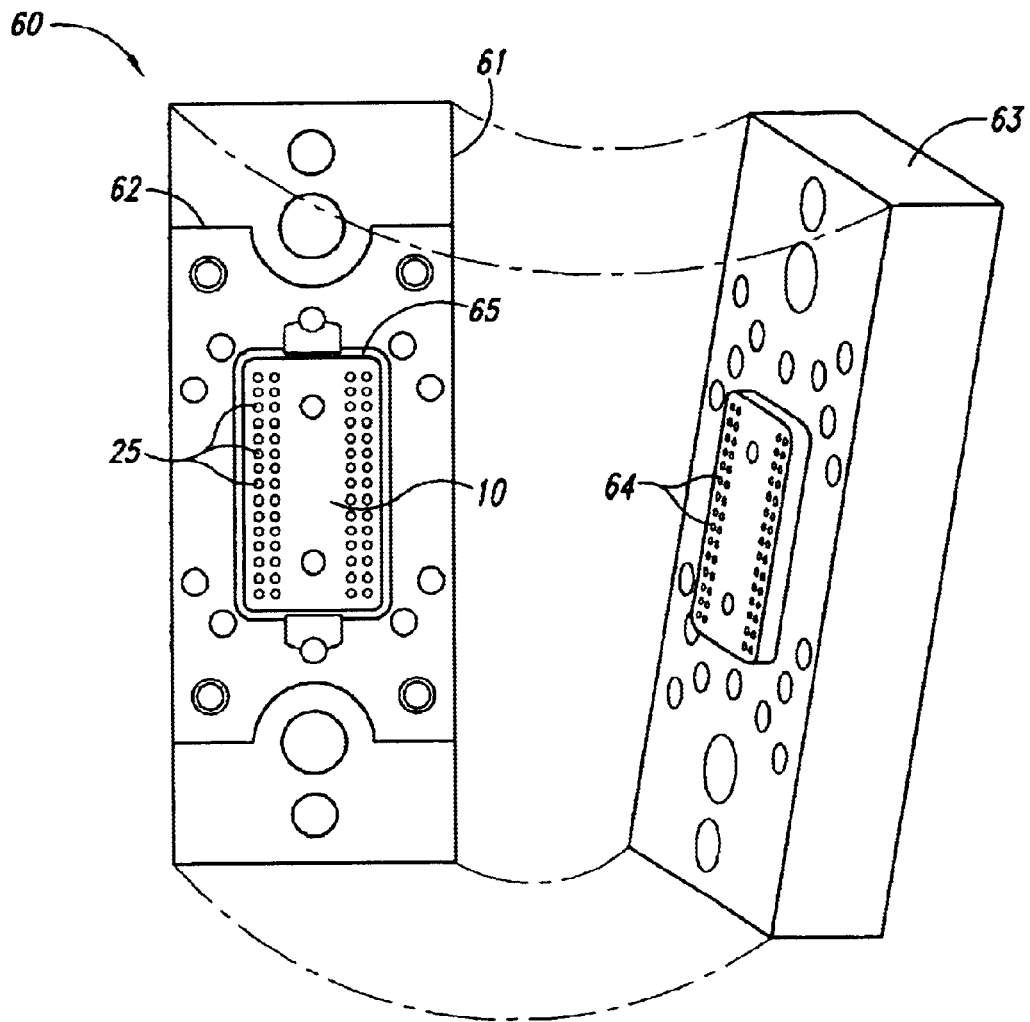
FIG. 2 is a partially exploded illustration of a test apparatus for testing microelectronic device packages in accordance with the prior art.

As described above with reference to FIGS. 1 and 2, a drawback with some conventional arrangements is that the solder balls and/or trace patterns of the packaged device can become dislodged during testing, which typically requires discarding the package. In some cases, it has been observed that the inactive solder balls and traces may become dislodged more frequently than the active solder balls and traces. Accordingly, in several of the embodiments described below, the inactive traces (or connection structures) are more securely attached to the support member, and/or are configured to be symmetric with the active traces (or connection structures). Accordingly, the solder balls or other conductive couplers disposed on the inactive connection structures can have a size, shape and support generally similar to the size, shape and support of the conductive couplers disposed on the active connection structures. As a result, the package can be less likely to be damaged during testing or installation.

Figure 3A:
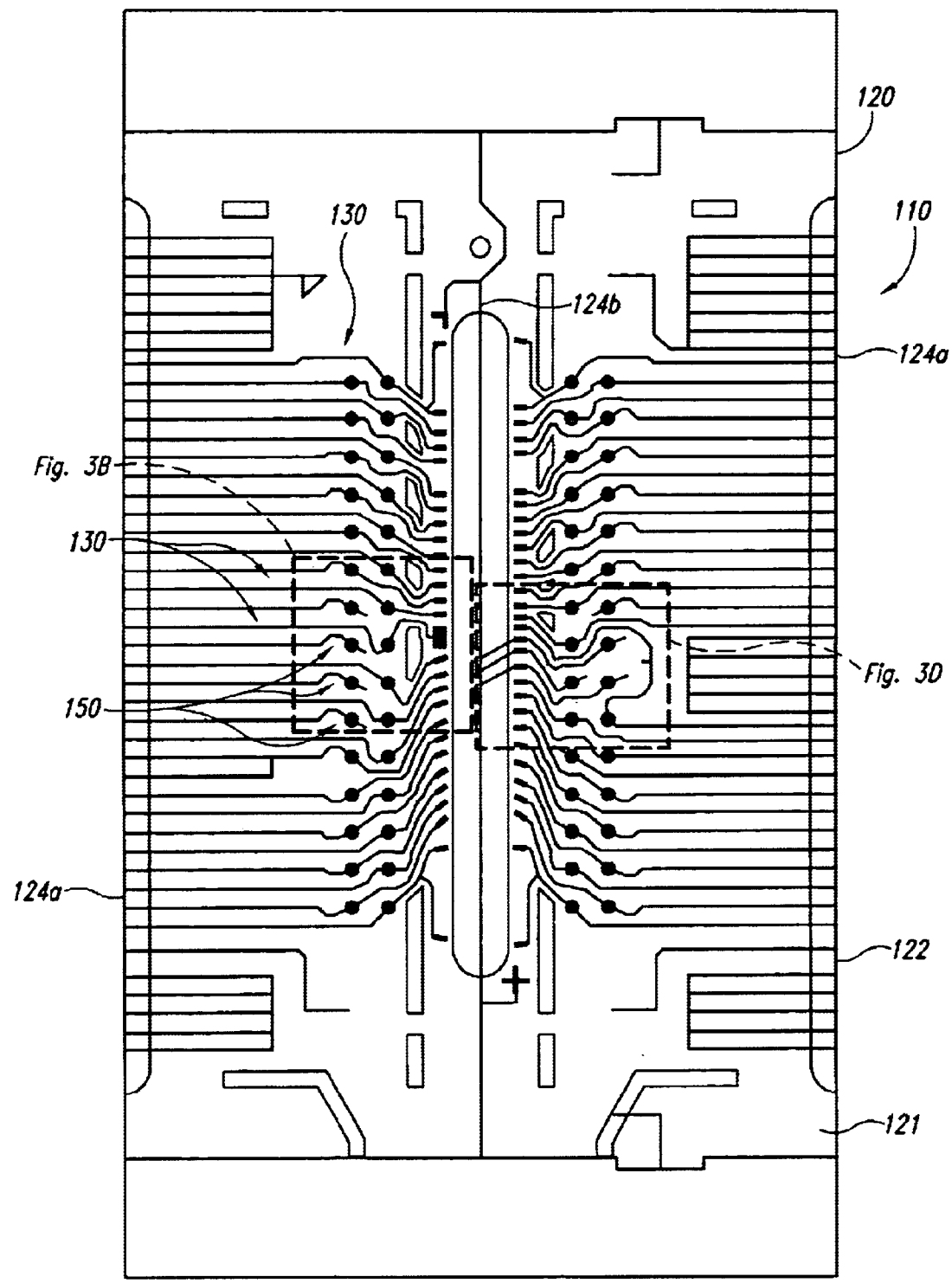
FIG. 3A is a plan view of a support member having active and inactive connection structures in accordance with an embodiment of the invention.

FIG. 3A is a plan view of an apparatus 110 having a support member 120 in accordance with an embodiment of the invention. The support member 120 can have a first surface 121 that supports active connection structures 130 and inactive connection structures 150. The first surface 121 can also include plating buses 124 (shown in FIG. 3A as edge plating buses 124a and a central plating bus 124b)that provide current for plating conductive materials onto the active connection structures 130 and the inactive connection structures 150 as these structures are manufactured. The support member 120 can further include a second surface 122 facing in an opposite direction from the first surface 121 and configured to support a microelectronic substrate for coupling to the active connection structures 130. The support member 120 can include a relatively thin sheet of flexible, epoxy resin, such as BT (bimaleimide triazine) or another suitable material.

Figure 3B:
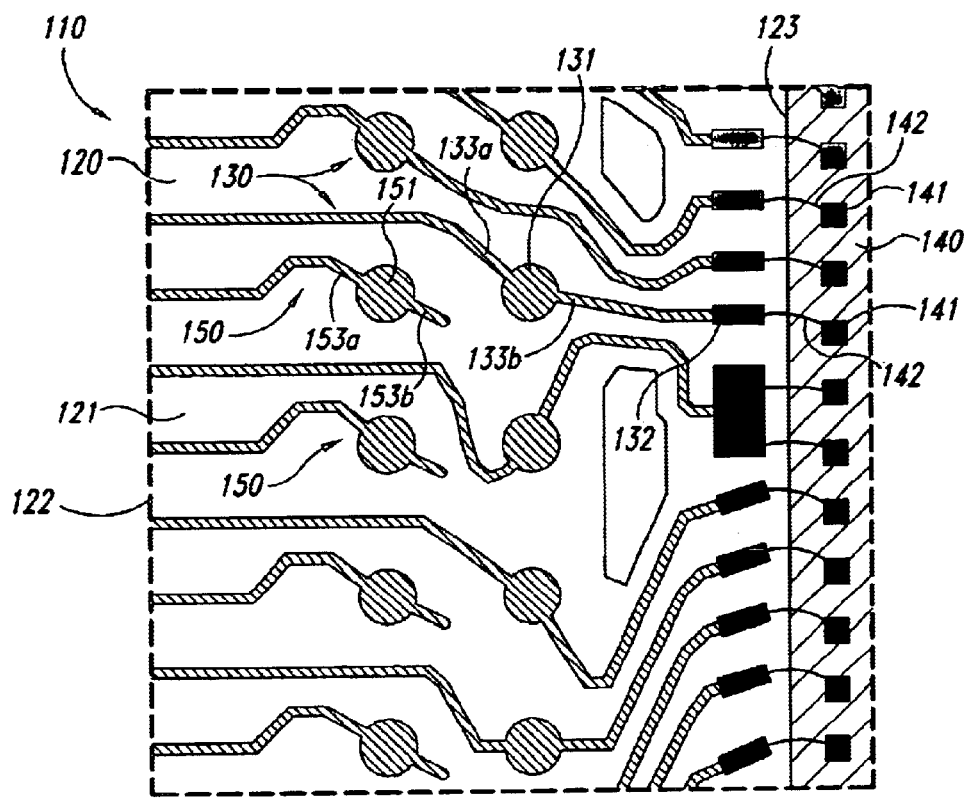
FIG. 3B is an enlarged view of a portion of the support member shown in FIG. 3A, connected to a microelectronic substrate in accordance with an embodiment of the invention.

FIG. 3B is a detailed plan view of a portion of the apparatus 110 described above with reference to FIG. 3A, attached to a microelectronic substrate 140. As shown in FIG. 3B, the central plating bus 124 (FIG. 3A) has been removed to form a slot 123 that extends through the support member 120 from the first surface 121 to the second surface 122. The microelectronic substrate 140 has been mounted to the second surface 122 of the support member 120 such that wire bond pads 141 of the microelectronic substrate 140 are accessible through the slot 123 for connecting to the active connection structures 130 on the first surface 121 of the support member 120.

The active connection structures 130 can each include an active bond site 131, such as a ball bond pad, which is configured to support a volume of a flowable conductive material, such as solder. When the flowable conductive material is disposed on the active bond site 131 and placed in a flowable state (for example, in a solder reflow oven), it can form an at least partially spherical or globular shape suitable for electrically and physically connecting the active connection structure 130 to other devices or circuit elements. The active connection structure 130 can further include two active elongated members 133, shown in FIG. 3B as active elongated members 133*a* and 133*b*. The active elongated member 133*a* extends away from the slot 123 for connecting to the edge plating bus 124*a* (FIG. 3A). The active elongated member 133*b* extends between the active bond site 131 and a wire bond pad 132 positioned adjacent to the slot 123. The wire bond pad 132 can be connected with a wire bond 142 to a corresponding one of the wire bond pads 141 of the microelectronic substrate 140 to provide electrical communication between the wire bond pad 141 and the active bond site 131.

The inactive connection structures 150 can each include an inactive bond site 151, such as a ball bond pad, coupled to two inactive elongated members 153, shown in FIG. 3B as inactive elongated members 153*a* and 153*b*. Accordingly, the inactive bond site 151 can support a flowable conductive material, such as a solder ball. The inactive elongated member 153*a* extends away from the slot 123 for connecting to the edge plating bus 124*a* (FIG. 3A). The inactive elongated member 153*b* can be shorter than the inactive elongated member 153*a* to define an elongated tab shape, and can remain electrically decoupled from the microelectronic substrate 140. Accordingly, the inactive bond sites 151 are not electrically connected to the microelectronic substrates 140; however, the solder balls they support (in combination with the solder balls of the active bond sites 131) can form a uniform pattern that is compatible with a variety of electronic devices and test fixtures.

Figure 3C:
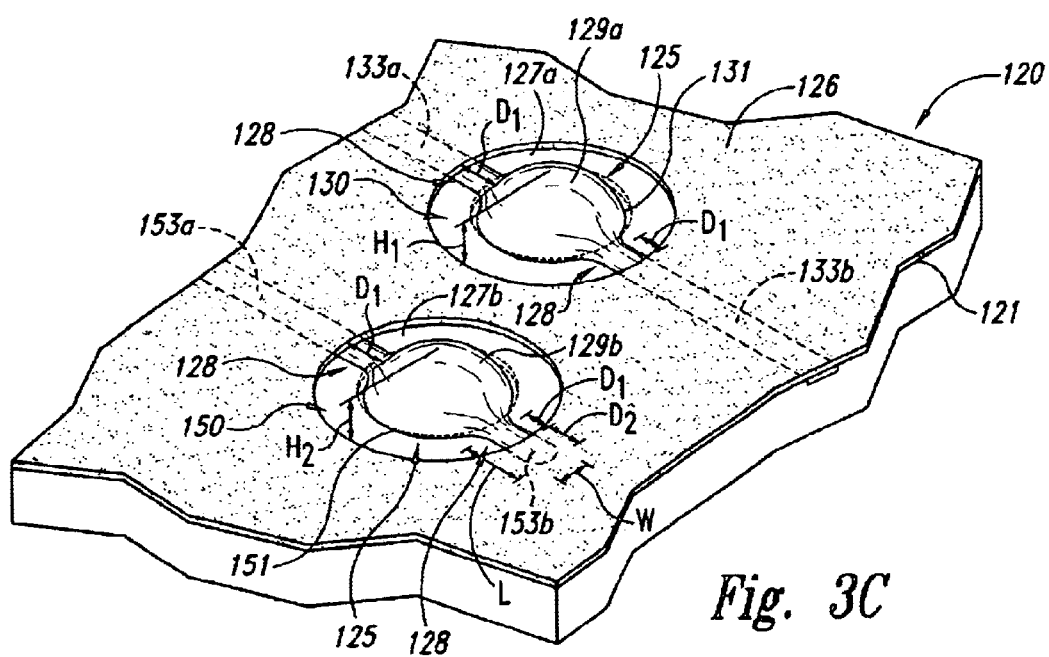
FIG. 3C is an isometric view of portions of active and inactive connection structures, with certain features shown schematically in accordance with an embodiment of the invention.

FIG. 3C is an isometric view of a portion of the support member 120 showing an active connection structure 130 and an inactive connection structure 150, each carrying a quantity of flowable conductive material 125 in accordance with an embodiment of the invention. Accordingly, the flowable conductive material 125 can form conductive couplers 129 (such as solder balls), shown in FIG. 3C as an active conductive coupler 129*a* supported by the active connection structure 130, and an inactive conductive coupler 129*b* supported by the inactive connection structure 150. In one aspect of this embodiment, the active elongated members 133*a,b* and the inactive elongated members 153*a,b* can include materials that are easily wetted by the flowable conductive material 125. For example, when the flowable conductive material 125 includes solder, the elongated members 153*a,b* and 133*a,b* can include nickel, gold, and/or copper or other metallic constituents. Accordingly, when the flowable conductive material 125 is disposed on the bond sites 131 and 151, it tends to wick along the elongated members 133*a,b* and 153*a,b*, respectively. When the flowable conductive material 125 solidifies to form the conductive couplers 129, it can have an at least partially elipsoid shape.

In a further aspect of this embodiment, the support member 120 can optionally include a cover layer 126 attached to the first surface 121 with the connection structures 130 and 150 disposed between the cover layer 126 and the first surface 121. In one embodiment, the cover layer 126 can include a solder mask, and in other embodiments, the cover layer 126 can include other materials. In any of these embodiments, the cover layer 126 can have apertures 127 (shown as apertures 127*a* and 127*b*) aligned with the bond sites 131 and 151, respectively. The apertures 127 are sized to leave the bond sites 131 and 151 exposed, while covering at least part of each elongated member 133*a,b* and 153*a,b* to aid in securing the elongated members to the support member 120. In an alternative embodiment (shown in dashed lines in FIG. 3C) the apertures are sized to leave the bond sites 131 and 151 exposed while covering each elongated member 133*a,b* and 153*a,b* up to the edge of the corresponding bond site 131, 151. In other embodiments, the elongated members 133*a,b* can be secured directly to the first surface 121 without the cover layer 126.

In one embodiment, the bond sites 131 and 150 can each have a diameter of about 330 microns, and each elongated member 133*a,b* and 153*a,b* (and in particular, the inactive elongated member 153*b*) can have a length L of at least 250 microns. The apertures 127*a,b* in the cover layer 126 can have a diameter of about 430 microns. Accordingly, each bond site 131, 151 can be completely exposed through the corresponding aperture 127*a*, 127*b*. A portion 128 of each elongated member 133*a,b* and 153*a,b* can also be exposed for a distance $D_1$ of about 50 microns, measured from the edge of the corresponding bond site 131, 151, respectively. The elongated member 153*b* can be covered by the cover layer 126 for a distance $D_2$ of about 200 microns, and the remaining elongated members can be covered for distances greater than $D_2$. In other embodiments, the foregoing dimensions can have other values.

In a further aspect of this embodiment, each elongated member 153*a,b* and 133*a,b* can have approximately the same width W in a direction transverse to the elongation direction to increase the likelihood that the flowable conductive material 125 will wick along each elongated member in at least approximately the same way. In yet a further aspect of this embodiment, the angular spacing between the active elongated members 133*a* and 133*b* can be about the same as the angular spacing between the inactive elongated members 131*a* and 131*b* (about 180° in FIGS. 3A–C).

One feature of the foregoing arrangement is that the number of inactive elongated members 153 extending away from the inactive bond site 151 is equal to the number of active elongated members 133 extending away from the active bond site 131. Accordingly, the cover layer 126 (or alternatively the elongated members alone) can provide approximately the same securing force to both the inactive connection structure 150 and the active connection structure 130. As a result, the inactive elongated members 153*a,b* can be less likely to pull away from the support member 120 when subjected to stresses, such as shear stresses which may be imposed on the conductive couplers 129 during testing. This feature can apply when the cover layer 126 covers some or all of the elongated members, and/or when the cover layer 126 is not implemented. This is unlike some conventional arrangements (such as those described above with reference to FIGS. 1 and 2) for which the inactive connection structure may have fewer elongated members than the active connection structure and may accordingly be more likely to pull away from the support member when subjected to shear or other stresses.

Another feature of an embodiment of the arrangement described above with reference to FIGS. 3A–C is that the inactive elongated members 153 can wick away the flowable conductive material 125 in generally the same manner and to generally the same extent as the active elongated members 133. For example, because the number of inactive elongated members 153 extending away from each inactive bond site 151 can be the same as the number of active elongated members 133 extending away from each active bond site 131, the flowable conductive material 125 will tend to wick away from both bond sites in generally the same way. Accordingly, approximately the same volume of flowable conductive material will tend to wick along each elongated member and away from each bond site, whether the bond site is active or inactive.

Another feature of an embodiment of the arrangement described above with reference to FIGS. 3A–C is that the angular spacing between adjacent inactive elongated members 153 can be about the same as the angular spacing between adjacent active elongated members 133. As a result, the overall size and shape of flowable conductive material 125 remaining on the inactive bond site 151 (forming the inactive conductive coupler 129b) can be approximately the same as the overall size and shape of the flowable conductive material 125 remaining on the active bond site 131 (forming the active conductive coupler 129a). For example, the height $H_2$ by which the inactive conductive coupler 129b projects from the support member 120 can be at least approximately the same as the height $H_1$ by which the active conductive coupler 129a projects from the support member 120.

Yet another feature of an embodiment of the arrangement describe above with reference to FIGS. 3A–C is that the distance $D_1$ can be at least approximately the same for both the active elongated members 133a,b and the inactive elongated members 153a,b. Accordingly, the flowable conductive material 125 (which tends to wick along the exposed portions of the elongated members, but not beneath the cover layer 126) can wick away from the inactive bond site 151 in generally the same manner and to generally the same extent as it wicks away from the active bond site 131. As a result, the shape of the inactive conductive coupler 129b can be at least approximately identical to the shape of the active conductive coupler 129a.

An advantage of the foregoing features is that the inactive conductive couplers 129b can be contacted by a conventional test fixture (such as the fixture 60 shown in FIG. 2) in generally the same manner as are the active conductive couplers 129a because the shapes and sizes of the conductive couplers 129a,b are about the same. This is unlike some conventional arrangements (such as the arrangement described above with reference to FIG. 1) in which the inactive solder balls may project from the support member by a greater distance than the active solder balls because the solder disposed on the inactive ball bond pads has fewer avenues along which to wick away. In such conventional arrangements, the inactive solder balls may come under greater stress during testing and may be more likely to become dislodged.

Figure 3D:
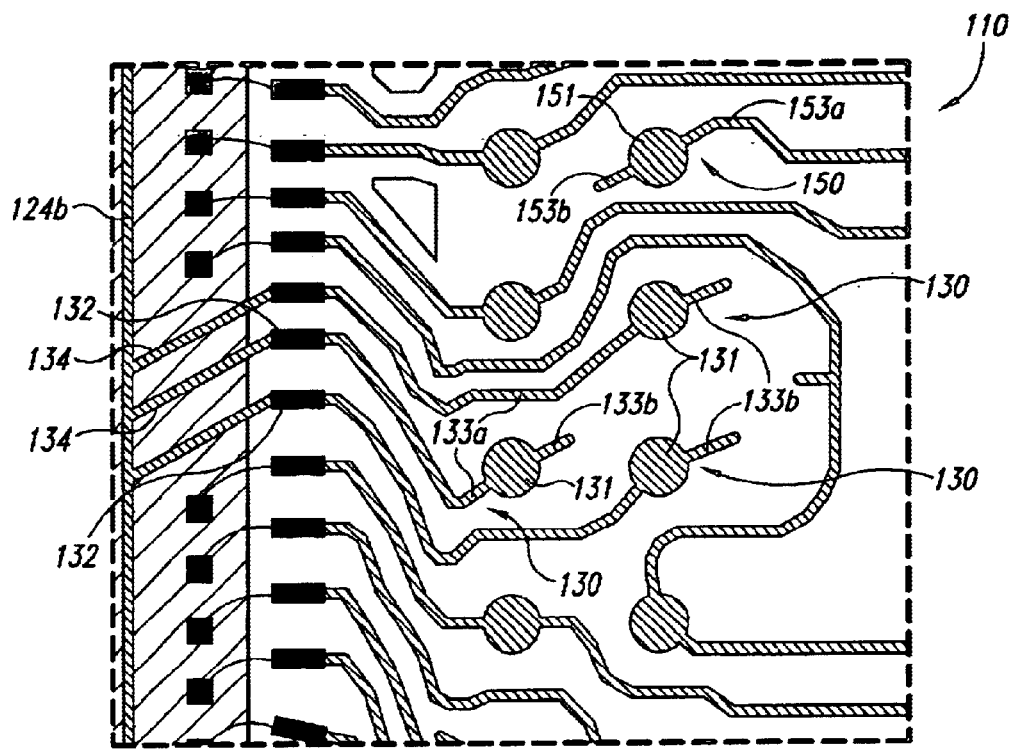
FIG. 3D is an enlarged plan view of another portion of the support member shown in FIG. 3A, connected to a microelectronic substrate in accordance with an embodiment of the invention.

FIG. 3D is an enlarged plan view of another portion of the apparatus 110 described above with reference to FIG. 3A. Three of the active connection structures 130 shown in FIG. 3D have an electroplating trace 134 connected between the central plating bus 124b and the corresponding wire bond pad 132. These active connection structures 130 also have an active elongated member 133a extending between the wire bond pad 132 and the corresponding bond site 131. These active connection structures 130 can further include an active elongated member 133b having an elongated tab shape generally similar to that of the inactive elongated members 153b described above. Accordingly, the active connection structures 130 and the inactive connection structure 150 shown in FIG. 3D can each have the same number of elongated members extending from the corresponding bond sites, and can accordingly carry conductive couplers (not shown in FIG. 3D) having at least approximately similar shapes in a manner generally similar to that described above with reference to FIGS. 3A–C.

Figure 4:
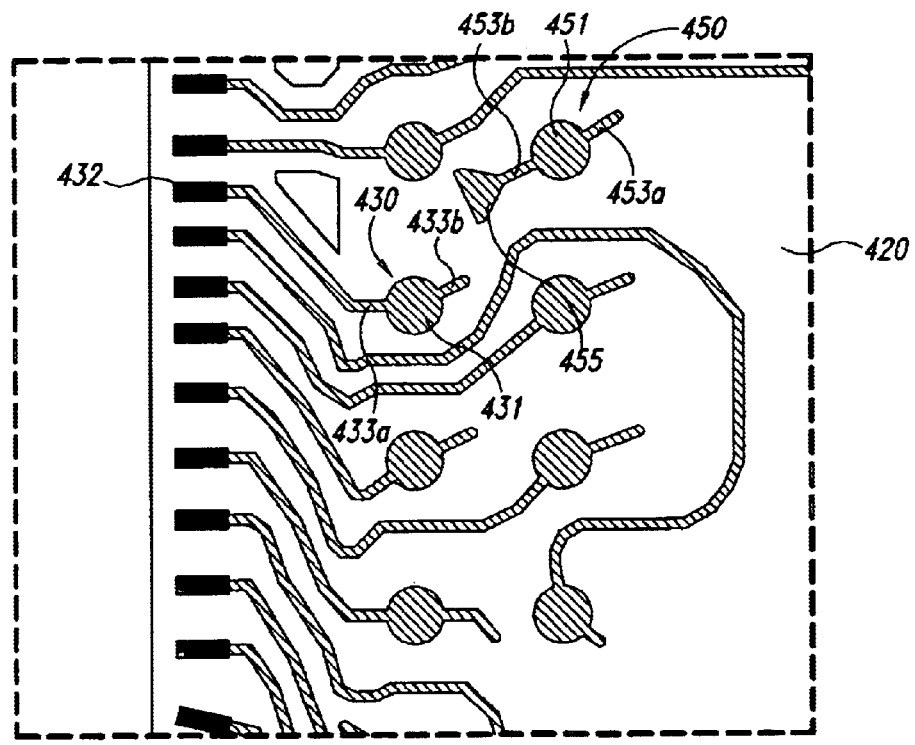
FIG. 4 is an enlarged plan view of a portion of a support member in accordance with another embodiment of the invention.

FIGS. 4–8 illustrate support members with connection structures having arrangements in accordance with further embodiments of the invention. For example, FIG. 4 illustrates a support member 420 having an active connection structure 430 and an inactive connection structure 450, neither of which includes an electroplating trace. Accordingly, the support member 420 can be processed electrolessly to plate the connection structures 430 and 450 during manufacturing. The active connection structure 430 can include an active bond site 431 having an active elongated member 433a connected to a corresponding wire bond pad 432 in a manner generally similar to that described above. The active connection structure 430 can also include a tab-shaped active elongated member 433b extending away from the active bond site 431.

The inactive connection structure 450 can include an inactive bond site 451 and two inactive elongated members 453a and 453b. In a further aspect of this embodiment, the inactive elongated member 453b can include an anchor 455 which can increase the strength of the connection between the inactive connection structure 450 and the support member 420. For example, the anchor 455 can provide more surface area beneath the corresponding cover layer 126 (not shown in FIG. 4), which can further reduce the likelihood for tearing the inactive connection structure 450 away from the support member 420 when the inactive connection structure 450 is subjected to a shear stress. In one embodiment, the anchor 455 can have a generally triangular shape, and in other embodiments, the anchor 455 can have other shapes. In still further embodiments, the anchor 455 can be included as part of any of the elongated members described above or below, when space permits.

Figure 5:
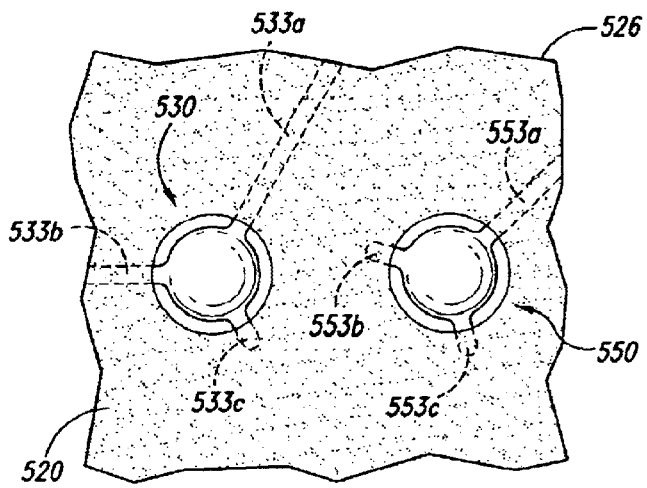
FIG. 5 is a plan view of a portion of a support member having active and inactive connection structures configured for electroplating in accordance with another embodiment of the invention.

FIG. 5 illustrates an embodiment of a support member 520 having an active connection structure 530 with three active elongated members 533a, 533b and 533c. The support member 520 can further include an inactive connection structure 550 having three inactive elongated members 553a, 553b and 553c. The elongated members 533a and 553a can be coupled to an edge plating bus (not shown in FIG. 5), and the elongated member 533b can be coupled to a wire bond pad (not shown in FIG. 5) in a manner generally similar to that described above. The elongated members 533a, 533b and 553a, as well as the elongated members 533c, 553b and 553c (which are not connected to other conductive structures) can extend beneath a cover layer 526 to secure the connection structures to the support member 520, as was generally discussed above. Alternatively, the cover layer 526 can be eliminated and the elongated members can be secured to the support member 520 with other techniques. In either embodiment, the active connection structure 530 and the inactive connection structure 550 can each include the same number of elongated members and can accordingly support conductive couplers having at least approximately similar shapes and sizes. In a further aspect of this embodiment, each elongated member can be angularly spaced apart from its neighbor by about 120°. In other embodiments, the angular spacing can have other values for which the angular spacings for the active elongated members 533a–c are at least generally similar to those for the inactive elongated members 553a–c.

Figure 6:
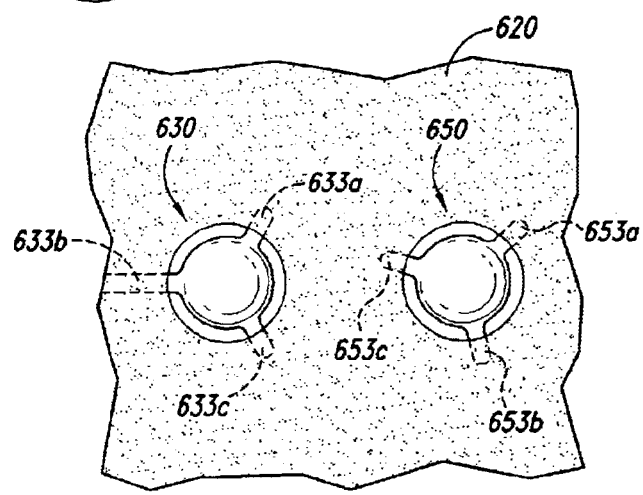
FIG. 6 is a plan view of a portion of a support member having active and inactive connection structures configured for electroless plating in accordance with another embodiment of the invention.

FIG. 6 illustrates a support member 620 having an active connection structures 630 and an inactive connection structures 650. These connection structures are generally similar to the connection structures described above except that the connection structures 630 and 650 are configured for electroless plating. Accordingly, the active connection structure 630 can include an active elongated member 633b coupled to a wire bond pad (not shown in FIG. 6), and can also include two tab-shaped elongated members 633a and 633c that are not connected to other conductive structures. All three inactive elongated members 653a–c can be unconnected to other conductive structures.

Figure 7:
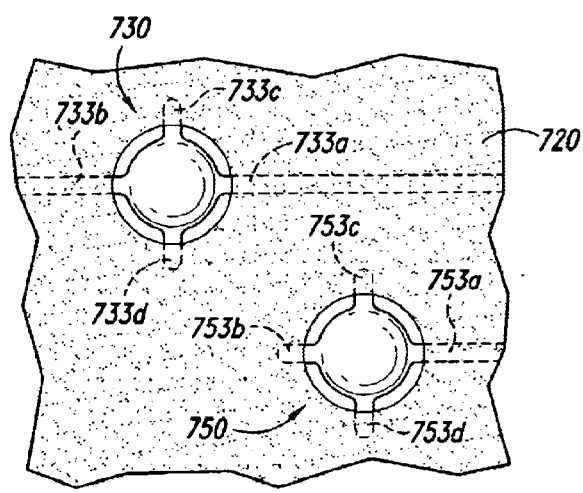
FIG. 7 is a plan view of a portion of a support member having active and inactive connection structures configured for electroplating in accordance with yet another embodiment of the invention.

FIG. 7 illustrates a support member 720 having an active connection structure 730 with four active elongated members 733a–d, and an inactive connection structure 750 having four inactive elongated members 753a–d. The elongated members 733a and 753a are each configured to be coupled to a plating bus in a manner generally similar to that described above with reference to FIGS. 3B and 5. In one aspect of this embodiment, each elongated member is angularly spaced apart from its neighbor by about 90°. In other embodiments, the angular spacing can have other values with the angular spacing between adjacent active elongated members 733a–d being approximately the same as the angular spacing between inactive elongated members 753a–d, and the number of active elongated members 733 being the same as the number of inactive elongated members.

Figure 8:
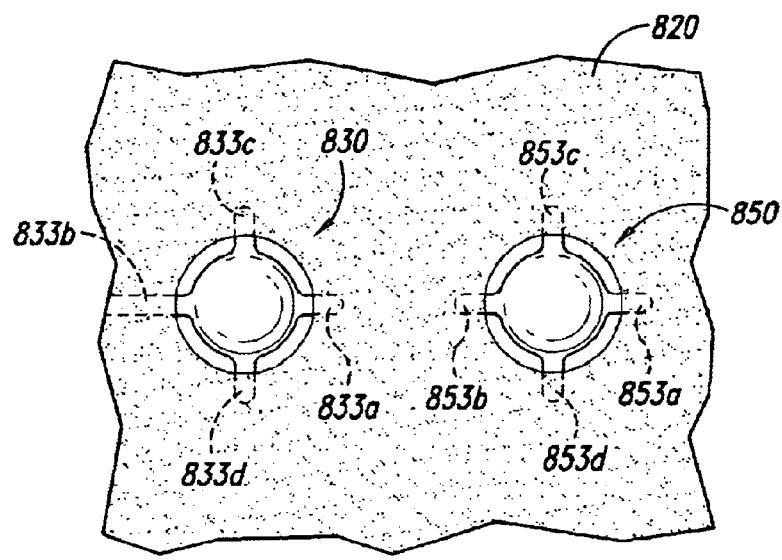
FIG. 8 is a plan view of a portion of a support member having active and inactive connection structures configured for electroless plating in accordance with still another embodiment of the invention.

FIG. 8 illustrates a support member 820 having an active connection structure 830 and an inactive connection structure 850, each configured for electroless plating. Accordingly, the active connection structure 830 can have four active elongated members 833a–d. The inactive connection structure 850 can have four inactive elongated members 853a–d. As described above, the number of and spacing between active elongated members 833a–d can be at least approximately the same as for the inactive elongated members 853a–d.

In other embodiments, the active and inactive connection structures can have other shapes and arrangements for which the number of elongated members extending outwardly from an active bond site is equal to the number of elongated members extending outwardly from an inactive bond site. In any of these arrangements, the connection structures and, optionally, the corresponding cover layers, can support conductive couplers (such as solder balls) having generally similar shapes and similar behaviors, regardless of whether the conductive couplers are carried by an active bond site or an inactive bond site.

Figure 9:
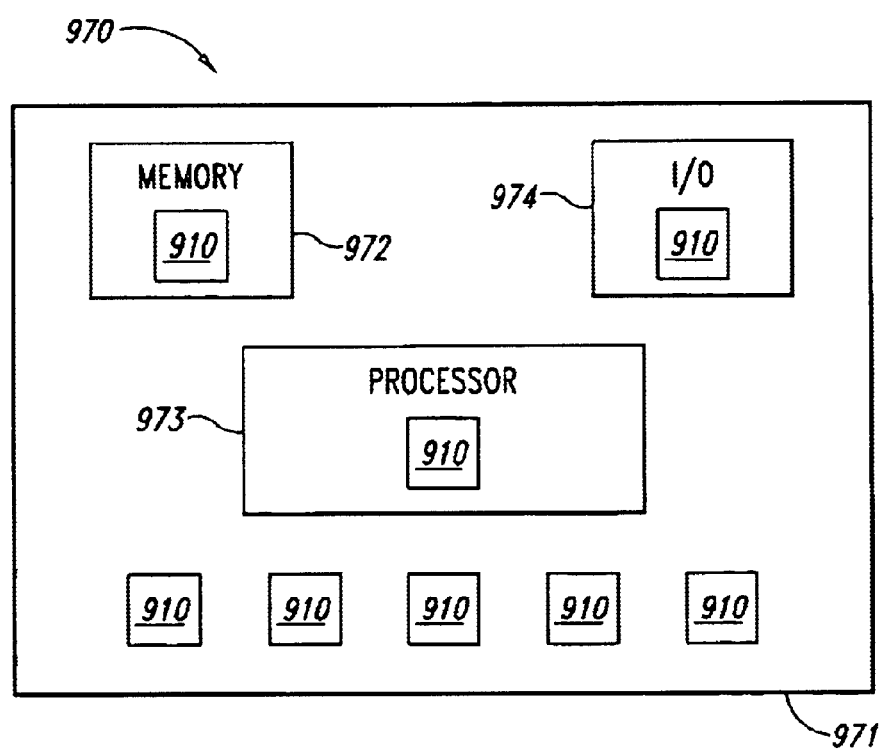
FIG. 9 is a schematic illustration of a device that includes apparatuses in accordance with another aspect of the invention.

FIG. 9 is a schematic illustration of an electronic device 970 that includes one or more apparatuses 910 in accordance with an embodiment of the invention. In one aspect of this embodiment, the electronic device can include a computer, a telecommunication device or another device that incorporates microelectronic components. Accordingly, the device 910 can include a housing 971 containing a processor 973, a memory 972 and/or an input/output device 974, each of which can include an apparatus 910 generally similar to any of the apparatuses described above with reference to FIGS. 3A–8. The device 910 can also include other apparatuses 910 in addition to or in lieu of the apparatuses incorporated into the processor 973, the memory 972 and/or the input/output device 974.

Figure 10:
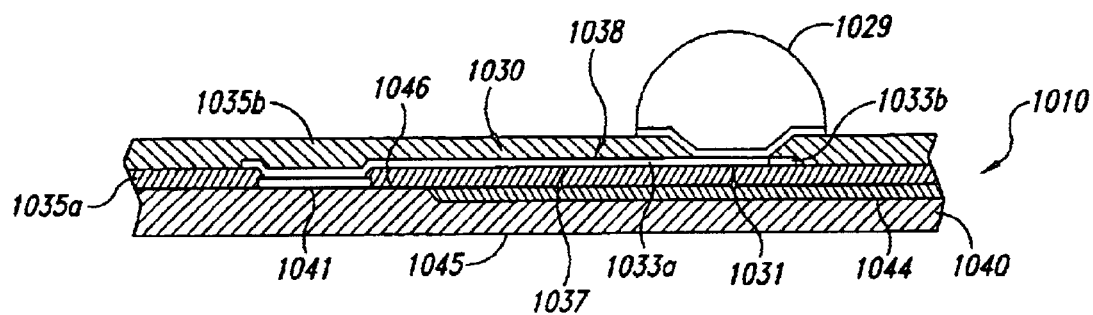
FIG. 10 is a cross-sectional side view of an apparatus including a microelectronic substrate and a connection structure in accordance with another embodiment of the invention.

FIG. 10 is a cross-sectional side view of an apparatus 1010 that includes a microelectronic substrate 1040 having a connection structure 1030 disposed on it in accordance with another embodiment of the invention. In one aspect of this embodiment, the microelectronic substrate 1040 can have a first surface 1045 and a second surface 1046 facing opposite from the first surface 1045. The microelectronic substrate 1040 can further include active microelectronic features 1044 positioned proximate to the second surface 1046, and a first bond site 1041 (such as a bond pad), also positioned proximate to the second surface 1046.

The connection structure 1030 can include a second bond site 1031 spaced apart from the first bond site 1041. The second bond site 1031 can include a solder ball pad, and can support a conductive coupler 1029, such as a solder ball. Accordingly, the appuratus 1010 can have a "flip chip" configuration. In other embodiments, the second bond site 1031 can have other configurations and can support other types of conductive couplers. In any of these embodiments, the connection structure 1030 can include an electrically conductive material (such as a metal redistribution layer) and can have a first surface 1037 facing toward the second surface 1046 of the microelectronic substrate 1040, and a second surface 1038 facing opposite from the first surface 1037. The connection structure 1030 can further include elongated members 1033a and 1033b extending outwardly from the second bond site 1031. In one aspect of this embodiment, the elongated member 1033a can be connected between the second bond site 1031 of the connection structure and the first bond site 1041 of the microelectronic substrate 1040. The elongated member 1033b can have a generally tab-shaped configuration, generally similar to those described above.

In a further aspect of this embodiment, the apparatus 1010 can include passivation layers 1035 (shown as a first passivation layer 1035a and a second passivation layer 1035b) positioned between electrically conductive elements of the apparatus 1010 to at least partially isolate these elements from each other For example, the first passivation layer 1035a can be positioned between the second surface 1046 (including the active microelectronic features 1044) of the microelectronic substrate 1040, and the first surface 1037 of the connection structure 1030. The second passivation layer 1035b can be positioned adjacent to the second surface 1038 of the connection structure 1030. In one aspect of this embodiment, the second passivation layer 1035b can perform at least some of the same functions as the cover layer 126 described above reference to FIG. 3C. Accordingly, the second passivation layer 1035b can aid in securing the connection structure 1030 to the microelectronic substrate 1044. In one embodiment, the second passivation layer 1035b can extend over the entire lengths of the elongated members 1033a, 1033b, while leaving the second connection site 1031 exposed to receive the conductive coupler 1029. Alternatively, the second passivation layer 1035b can leave portions of the elongated members 1033a, 1033b proximate to the second bond site 1031 exposed to allow the conductive coupler 1029 to wick along the elongated members 1033a, 1033b, generally as was described above with reference to FIG. 3C.

Figure 11:
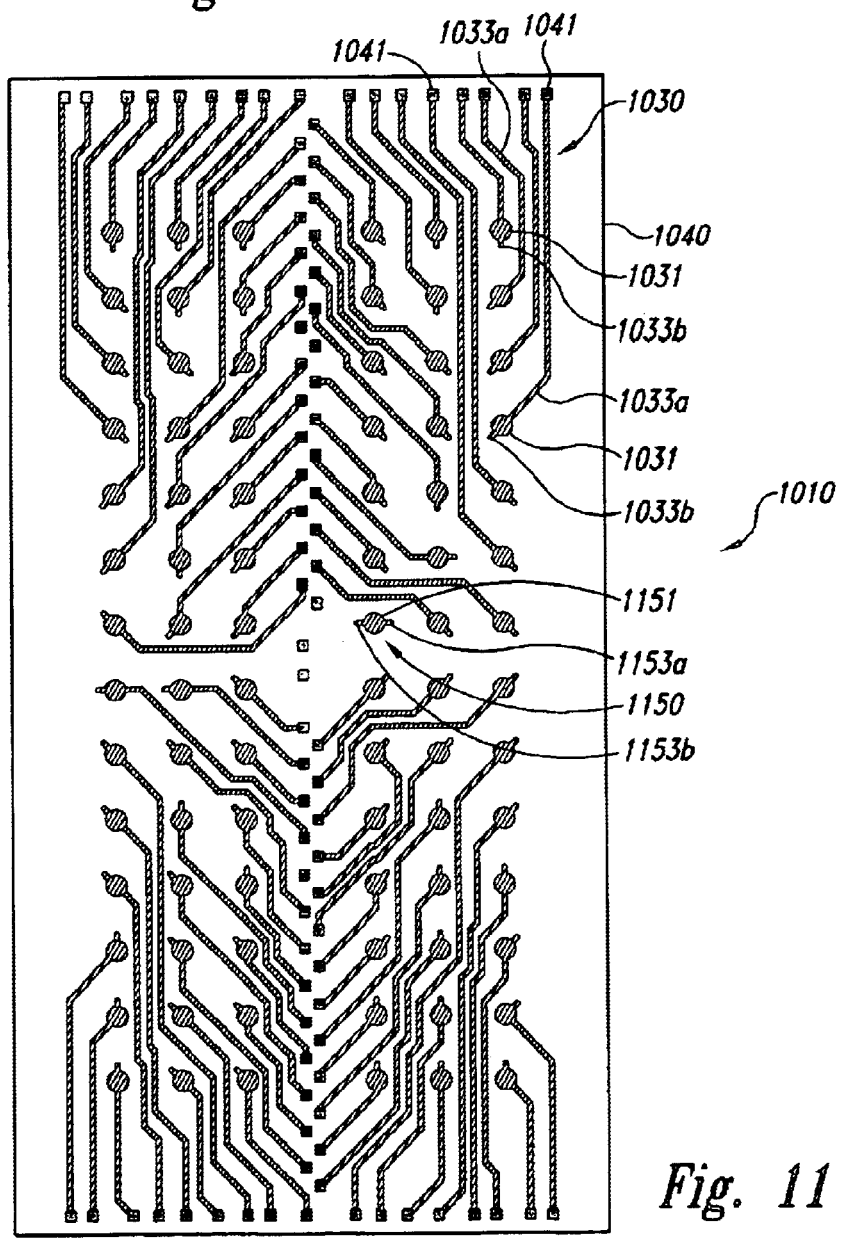
FIG. 11 is a plan view of the apparatus shown in FIG. 10 in accordance with an embodiment of the invention.

FIG. 11 is a plan view of an embodiment of the apparatus 1010 described above with reference to FIG. 10. In one aspect of this embodiment, each of the elongated members 1033a can extend between the corresponding first bond site 1041 of the microelectronic substrate 1040 and the corresponding second bond site 1031, and can be generally co-planer with each other. In an alternative embodiment, the elongated members 1033a can cross over each other, for example, by extending into different planes normal to the plane of FIG. 11 to avoid electrical contact with the elongated members over which they pass.

In a further aspect of this embodiment, the apparatus 1010 can include an inactive connection structure 1150 having a second bond site 1151. Elongated members 1153a, 1153b can extend outwardly from the second bond site 1151, without being electrically connected to the microelectronic substrate 1040. Accordingly, the inactive connection structures 1150 can support a conductive coupler to provide uniformity with a pre-selected pattern of conductive couplers, in a manner generally similar to that described above.

Figure 12A:
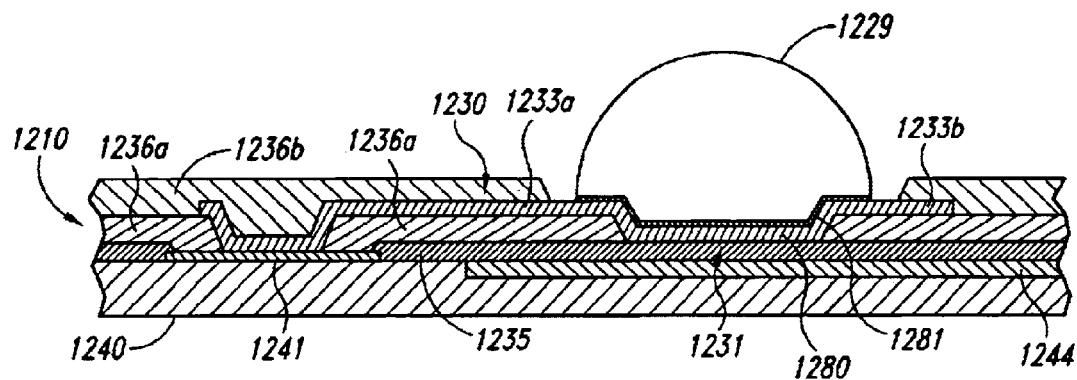
FIG. 12A is a cross-sectional side view of an apparatus including a microelectronic substrate and a connection structure having elongated members in accordance with yet another embodiment of the invention.
Figure 12B:
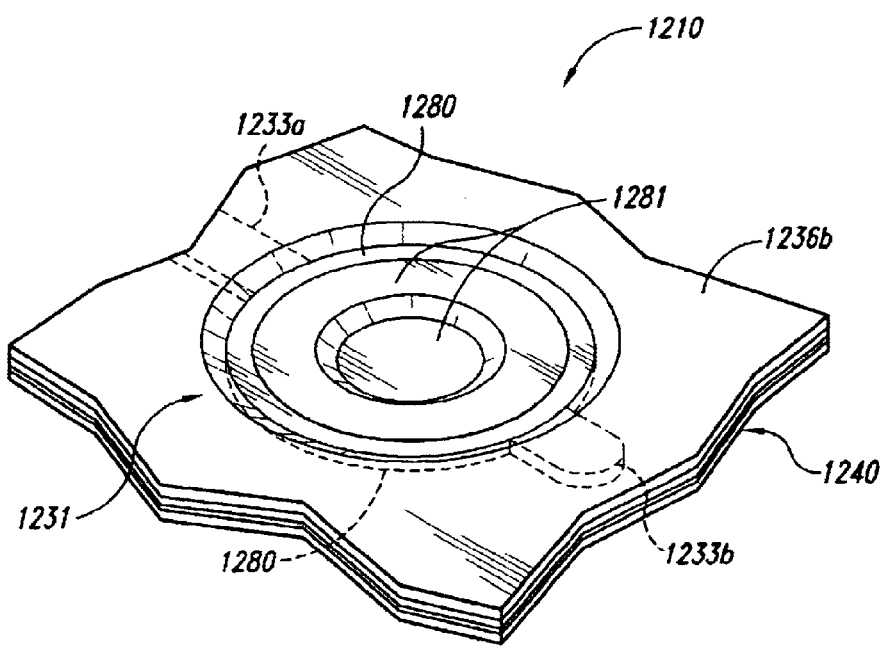
FIG. 12B is a top isometric view of a portion of the apparatus shown in FIG. 12A.

FIGS. 12A–B illustrate a cross-sectional side view and top isometric view, respectively, of an apparatus 1210 in accordance with another embodiment of the invention. In one aspect of this embodiment, the apparatus 1210 can include a microelectronic substrate 1240 having a first bond site 1241, and a connection structure 1230 having a second bond site 1231. The microelectronic substrate 1240 can include active devices 1244 electrically coupled to the first bond site 1241. The connection structure 1230 can include a plurality of elongated members 1233 (two are shown in FIGS. 12A–B as elongated members 1233a, 1233b) extending outwardly from the second bond site 1231. In one aspect of this embodiment, the elongated member 1233a can be coupled between the first bond site 1241 and the second bond site 1231, and the elongated member 1233b can include an elongated tab-shaped member generally similar to those described above. The bond site 1231 can include a support portion 1280 carrying a wettable portion 1281. The support portion 1280 can have a composition generally similar to that of the elongated members 1233a–1233b (for example, a composite of aluminum, nickel, copper and titanium), and the wettable portion 1281 can have a different composition (such as a composite of nickel and copper). Accordingly, the wettable portion 1281 can be configured to be wetted by a flowable conductive material (such as solder) to support and electrically couple to a conductive coupler 1229.

In a further aspect of this embodiment, the apparatus 1210 can include a die passivation layer 1235 positioned between the active devices 1244 and the connection structure 1230. A first dielectric layer 1236a can be disposed between the passivation layer 1235 and the elongated members 1233a, 1233b, and a second dielectric layer 1236b can be disposed on top of the connection structure 1230. In one aspect of an embodiment shown in FIGS. 12A and B, the elongated members 1233a, 1233b are not wetted by the conductive coupler 1229 because the wettable portion 1281 of the second bond site 1231 does not extend over the elongated members. In an alternate embodiment, the elongated members 1233a, 1233b can be wetted by the conductive coupler 1229 in a manner generally similar to that described above with reference to FIG. 3C.

Figure 13A:
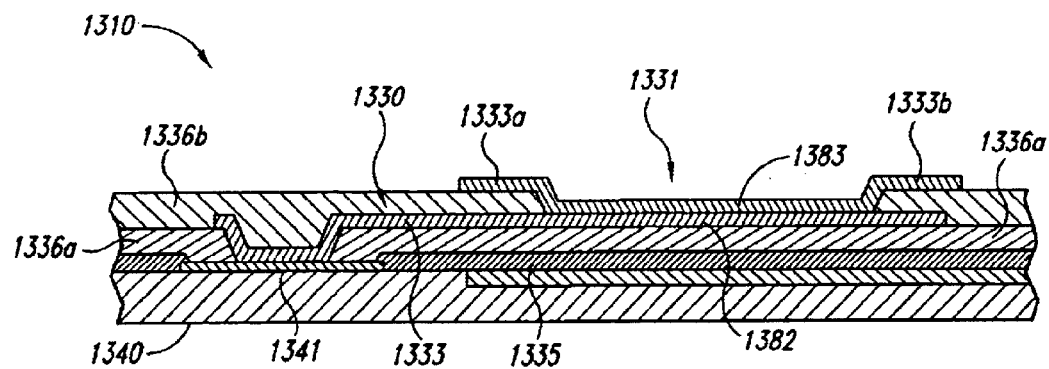
FIG. 13A is a cross-sectional side view of an apparatus including a microelectronic substrate and a connection structure in accordance with still another embodiment of the invention.
Figure 13B:
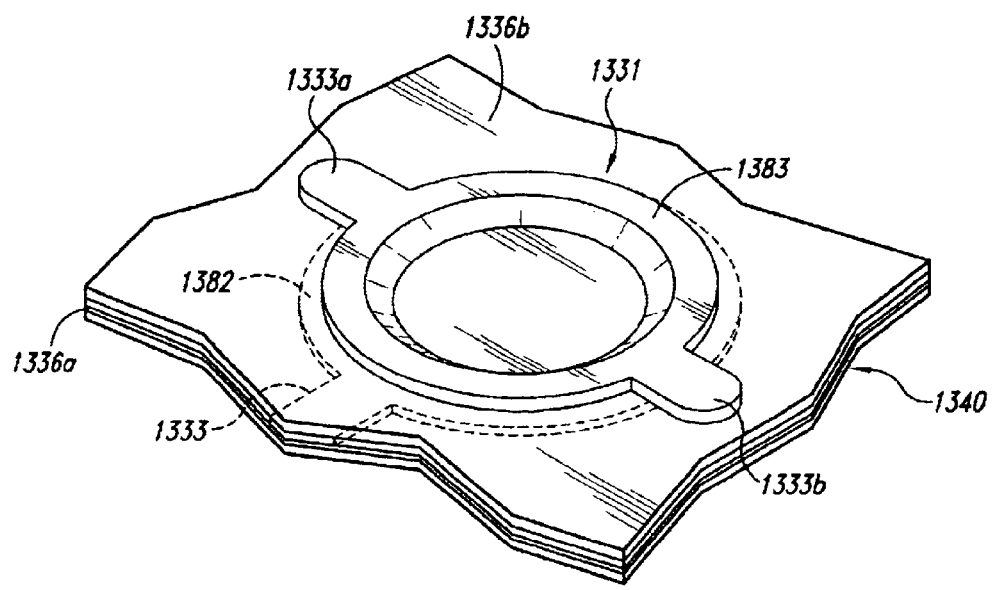
FIG. 13B is a top isometric view of a portion of the apparatus shown in FIG. 13A.

FIG. 13A is a cross-sectional side view of an apparatus 1310 having a connection structure 1330 in accordance with another embodiment of the invention. FIG. 13B is a top isometric view of a portion of the apparatus 1310 shown in FIG. 13A. Referring first to FIG. 13A, the apparatus 1310 can include a microelectronic substrate 1340 having a first bond site 1341, a passivation layer 1335, and a first dielectric layer 1336a disposed on the passivation layer 1335. The connection structure 1330 can be disposed on the first dielectric layer 1336a and can include a second bond site 1331 electrically connected to the first bond site 1341 with a connecting trace 1333.

Referring now to FIGS. 13A and 13B, the second bond site 1331 can include a generally circular first portion 1382 positioned on the first dielectric layer 1336a and electrically connected to the connecting trace 1333. A second dielectric layer 1336b can be disposed on the connection structure 1330, including the first portion 1382 of the second bond site 1331. The second bond site 1331 can further include a second portion 1383 electrically connected to the first portion 1382 and having at least two elongated members 1333a, 1333b extending outwardly therefrom over the second dielectric layer 1336b. In one aspect of this embodiment, the first portion 1382 can include a composite of titanium and either copper or aluminum, and the second portion 1383 can include a composite of titanium, copper, and nickel. In other embodiments, these components can include other constituents. In any of these embodiments, the elongated member 1333a, 1333b can provide some or all of the advantages described above with reference to the foregoing figures.

FIG. 14 illustrates a top plan view of a support member 1420 for supporting a microelectronic substrate in accordance with another embodiment of the invention. In one aspect of this embodiment, the support member 1420 can include a first surface 1421 and a second surface 1422 facing opposite from the first surface 1421. The second surface 1422 can be configured to carry a microelectronic substrate. The support member 1420 can include connection structures 1430 for connecting the microelectronic substrate supported on the support member 1420 to other electronic or microelectronic devices. In one aspect of this embodiment, each connection structure 1430 can include a first bond site (such as a solder pad) described below with reference to FIG. 15, and a second bond site 1432, such as a wire bond pad, configured to be electrically coupled to corresponding terminals of the microelectronic substrate. The connection structure 1430 can further include electroplating traces 1434 configured to connect to a source of electrical potential for plating the connection structure 1430, generally in a manner similar to that described above. Alternatively, the connection structures 1430 can be plated with an electroless process.

The connection structures 1430 can further include a connecting trace 1439 that extends outwardly from the second bond site 1432. The connecting trace 1439 can be coupled to a via 1436 that extends from the second surface of the support member 1420 to the first surface 1421. The via 1436 can be electrically coupled to the first bond site of the support member 1420, as described in greater detail below with reference to FIG. 15.

Figure 15:
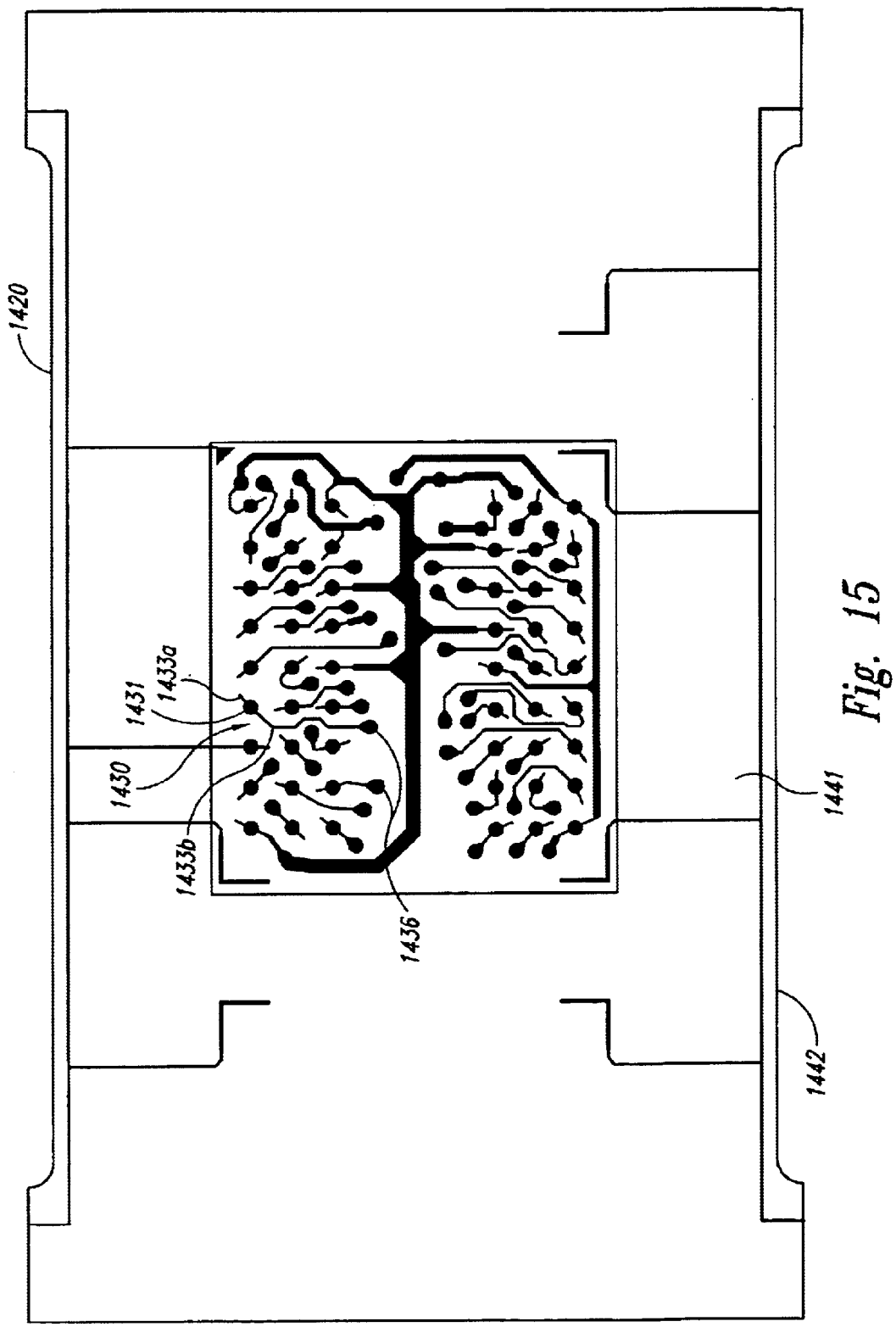
FIG. 15 is a bottom plan view of the support member shown in FIG. 14 in accordance with an embodiment of the invention.

FIG. 15 is a bottom plan view of an embodiment of the support member 1420 described above with reference to FIG. 14. As shown in FIG. 15, each of the vias 1436 of the connection structures 1430 can extend through the support member 1420 to the first surface 1421. Each via 1436 can be electrically connected to a corresponding first bond site 1431 (such as a solder ball pad), to provide for electrical communication between the first bond site 1431 and the second bond site 1432 (FIG. 14) on the opposite side of the support member. Accordingly, each connection structure 1430 can include at least two elongated members 1433a, 1433b extending outwardly from the first bond site 1431. The elongated member 1433b can extend between the first bond site 1431 and the via 1436 to provide for electrical communication between these two components of the connection structure 1430. The elongated member 1433a can include a generally tab-shaped structure generally similar to those described above. Accordingly, the elongated members 1433a, 1433b can provide some or all of the functions and advantages described above with reference to FIGS. 3A–8. For example, in one aspect of this embodiment, the elongated members 1433a, 1433b can aid in securing the first bond site 1431 to the first surface 1421 of the support member 1420. The support member 1420 can include a cover layer generally similar to that described above with reference to FIG. 3C to aid in attaching the connection structure 1430 to the first surface 1421. Accordingly, the cover layer can be configured to either allow or prevent wicking of a flowable conductive material along the elongated members 1433a, 1433b.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. An apparatus for supporting a microelectronic substrate, comprising:
    a support substrate having a first surface configured to carry a microelectronic substrate and a second surface facing opposite from the first surface;
    a first connection structure disposed on the second surface of the support substrate and configured to remain decoupled from the microelectronic substrate when the support substrate carries the microelectronic substrate, the first connection structure having a first bond site configured to receive a flowable conductive material, the first connection structure further having a first number of first elongated members connected to and extending outwardly from the first bond site, wherein none of the first elongated members is configured to be electrically connected to the microelectronic substrate; and
    a second connection structure disposed on the second surface of the support substrate, the second connection structure having a second bond site configured to receive a flowable conductive material, the second connection structure being configured to be coupled to the microelectronic substrate when the support substrate carries the microelectronic substrate, the second connection structure further having a second number of second elongated members extending outwardly from the second bond site, the second number being the same as the first number.

2. The apparatus of claim 1 wherein each of the first elongated members is configured to receive at least a portion of the flowable conductive material and wherein each of the second elongated members is configured to receive at least a portion of the flowable conductive material.

3. The apparatus of claim 1, further comprising a layer disposed on the first and second elongated members and attached to the support substrate, the layer having a first aperture aligned with the first bond site and a second aperture aligned with the second bond site, and wherein a covered portion of each first and second elongated members extends between the layer and the support substrate, and an exposed portion of each elongated member is exposed through one of the first and second apertures, further wherein each exposed portion has approximately the same length.

4. The apparatus of claim 1, further comprising a layer disposed on the first and second elongated members and attached to the support substrate, the layer having a first aperture aligned with the first bond site and a second aperture aligned with the second bond site, and wherein the layer covers junctions between the first bond site and the first elongated members, and covers junctions between the second bond site and the second elongated members.

5. The apparatus of claim 1 wherein the first bond site includes a solder pad having a diameter of about 330 microns and wherein at least one of the first elongated members has a length of about 250 microns, further wherein the apparatus further comprises a solder mask disposed over the first and second elongated members and attached to the support substrate, the solder mask having a first aperture aligned with the first bond site and a second aperture aligned with the second bond site, and wherein a covered portion of the at least one first elongated member extends beneath the solder mask for a distance of about 200 microns.

6. The apparatus of claim 1 wherein the second connection structure has a third bond site configured to be wire bonded to the microelectronic substrate when the microelectronic substrate is carried by the support substrate, and wherein at least one of the second elongated members extends between the second and third bond sites.

7. The apparatus of claim 1 wherein the first and second elongated members are configured to be wetted by the flowable conductive material when the flowable conductive material is disposed on the first bond site and placed in a flowable state.

8. The apparatus of claim 1 wherein the first conductive structure includes two first elongated members extending away from opposite sides of the first bond site.

9. The apparatus of claim 1, further comprising a layer disposed on the first and second elongated members and attached to the support substrate, the layer having a first aperture aligned with the first bond site and a second aperture aligned with the second bond site.

10. The apparatus of claim 1 wherein the first connection structure includes at least one electrically conductive metallic material.

11. The apparatus of claim 1 wherein one of the first elongated members is shorter than another of the first elongated members.

12. The apparatus of claim 1 wherein at least one of the elongated members is temporarily coupled to a plating bus to provide electrical current to the first connection structure during formation of the support substrate.

13. The apparatus of claim 1 wherein the first bond site includes a solder ball pad, and wherein the apparatus further comprises a solder ball disposed on the solder ball pad.

14. The apparatus of claim 1, further comprising:
    a first solder ball disposed on the first bond site and having a first size and shape;
    a second solder ball disposed on the second bond site and having a second size at least approximately the same as the first size, and a second shape at least approximately the same as the first shape; and
    a microelectronic substrate carried by the support substrate, the microelectronic substrate being electrically coupled to the second connection structure and being electrically isolated from the first connection structure.

15. The apparatus of claim 1 wherein the first connection structure and the second connection structure each have two elongated members.

16. The apparatus of claim 1 wherein the first connection structure and the second connection structure each have three elongated members.

17. The apparatus of claim 1 wherein at least one of the first elongated members has a first end connected to the first bond site and a second end spaced apart from the first bond site, and wherein the at least one first elongated member includes an anchor toward the second end to secure the at least one first elongated member to the support substrate.

18. The apparatus of claim 1 wherein each of the first and second elongated members has an axis along which the member is elongated and wherein each member has a width transverse to the axis, further wherein the widths of all the elongated members on the support substrate are approximately equal.

19. The apparatus of claim 1 wherein the support substrate includes a slot extending between the first and second surfaces, the slot being positioned to receive wires extending between the second connection structure and the microelectronic substrate when the support substrate carries the microelectronic substrate.

20. The apparatus of claim 1, further comprising:
a first solder ball disposed on the first bond site and projecting away from the first bond site by a first distance; and
a second solder ball disposed on the second bond site and projecting away from the second bond site by a second distance at least approximately the same as the first distance.

21. An apparatus for supporting a microelectronic substrate, comprising:
a support substrate having a first surface configured to carry a microelectronic substrate and a second surface facing opposite from the first surface;
a first bond site disposed on the second surface of the support substrate and configured to remain decoupled from the microelectronic substrate when the support substrate carries the microelectronic substrate;
first elongated members connected to and extending outwardly from the first bond site;
a first portion of a flowable conductive material disposed on the first bond site, the first portion of the flowable conductive material projecting from the first bond site in a direction generally normal to the first bond site by a first distance;
a second bond site disposed on the second surface of the support substrate and configured to be electrically coupled to the microelectronic substrate when the support substrate carries the microelectronic substrate;
second elongated members extending outwardly from the second bond site; and
a second portion of a flowable conductive material disposed on the second bond site, the second portion of the flowable conductive material projecting from the second bond site in a direction generally normal to the second bond site by a second distance at least approximately equal to the first distance.

22. The apparatus of claim 21 wherein the first bond site has a total of a first number of first elongated members and the second bond site has a total of a second number of second elongated members, and wherein the first number is the same as the second number.

23. The apparatus of claim 21, further comprising a third bond site configured to be wire bonded to the microelectronic substrate when the microelectronic substrate is carried by the support substrate, and wherein at least one of the second elongated members extends between the second and third bond sites.

24. The apparatus of claim 21 wherein at least part of the first portion of the flowable conductive material extends along the first elongated members, and wherein at least part of the second portion of the flowable conductive material extends along the second elongated members.

25. The apparatus of claim 21 wherein the first elongated members include two first elongated members extending away from opposite sides of the first bond site.

26. The apparatus of claim 21, further comprising a layer disposed on the first and second elongated members and attached to the support substrate, the layer having a first aperture aligned with the first bond site and a second aperture aligned with the second bond site.

27. The apparatus of claim 21, further comprising a layer disposed on the first and second elongated members and attached to the support substrate, the layer having a first aperture aligned with the first bond site and a second aperture aligned with the second bond site, and wherein a covered portion of each first and second elongated member extends between the layer and the support substrate and an exposed portion of each elongated member is exposed through one of the first and second apertures, further wherein each exposed portion has approximately the same length.

28. The apparatus of claim 21 wherein the first elongated members include at least one electrically conductive metallic material.

29. The apparatus of claim 21 wherein the first bond site includes a solder ball pad, and wherein the flowable conductive material includes a solder ball disposed on the solder ball pad.

30. The apparatus of claim 21, further comprising:
a first solder ball disposed on the first bond site;
a second solder ball disposed on the second bond site; and
a microelectronic substrate carried by the support substrate, the microelectronic substrate being electrically coupled to the second bond site and being electrically isolated from the first bond site.

31. The apparatus of claim 21 wherein at least one of the first elongated members has a first end connected to the first bond site and a second end spaced apart from the first bond site, and wherein the at least one first elongated member includes an anchor toward the second end to secure the at least one first elongated member to the support substrate.

32. An apparatus for supporting a microelectronic substrate, comprising:
a support substrate having a first surface configured to carry a microelectronic substrate and a second surface facing opposite from the first surface;
a first connection structure disposed on the second surface of the support substrate and having a first bond site configured to receive a flowable conductive material and remain electrically isolated from the microelectronic substrate when the microelectronic substrate is carried by the support substrate, the first connection structure further having at least two first elongated members connected to and extending outwardly from the first bond site, wherein each of the first elongated members is configured to receive at least a portion of the flowable conductive material; and
a plurality of second connection structures disposed on the second surface of the support substrate, each second connection structure having a second bond site configured to receive a flowable conductive material, each second connection structure being configured to be electrically coupled to the microelectronic substrate when the support substrate carries the microelectronic substrate, each second connection structure still further having at least two second elongated members extending outwardly from the second bond site, wherein each of the second elongated members is configured to receive at least a portion of the flowable conductive material from the second bond site, further wherein none of the second connection structures are coupled to any first connection structures of the support substrate.

33. The apparatus of claim 32 wherein all of the first and second connection structures of the support substrate have the same number of elongated members.

34. The apparatus of claim 32 wherein each second connection structure has a third bond site configured to be wire bonded to the microelectronic substrate when the microelectronic substrate is carried by the support substrate, and wherein and at least one of the second elongated members of each second connection structure extends between the second and third bond sites of that second connection structure.

35. The apparatus of claim 32 wherein the first and second elongated members are configured to be wetted by the flowable conductive material when the flowable conductive material is disposed on the first bond site and placed in a flowable state.

36. The apparatus of claim 32 wherein the first conductive structure includes two first elongated members extending away from opposite sides of the first bond site.

37. The apparatus of claim 32, further comprising a layer disposed on the first and second elongated members and attached to the support substrate, the layer having a first aperture aligned with the first bond site and a second aperture aligned with the second bond site.

38. The apparatus of claim 32, further comprising a layer disposed on the first and second elongated members and attached to the support substrate, the layer having a first aperture aligned with the first bond site and a second aperture aligned with the second bond site, and wherein a covered portion of each first and second elongated member extends between the layer and the support substrate, and an exposed portion of each elongated member is exposed through one of the first and second apertures, further wherein each exposed portion has approximately the same length.

39. The apparatus of claim 32 wherein the first connection structure includes at least one electrically conductive metallic material.

40. The apparatus of claim 32 wherein the first bond site includes a solder ball pad, and wherein the apparatus further comprises a solder ball disposed on the solder ball pad.

41. The apparatus of claim 32, further comprising:
a first solder ball disposed on the first bond site;
a second solder ball disposed on the second bond site of each second connection structure; and
a microelectronic substrate carried by the support substrate, the microelectronic substrate being electrically coupled to the second connection structures and being electrically isolated from the first connection structure.

42. The apparatus of claim 32 wherein at least one of the first elongated members has a first end connected to the first bond site and a second end spaced apart from the first bond site, and wherein the at least one first elongated member includes an anchor toward the second end to secure the at least one first elongated member to the support substrate.

43. The apparatus of claim 32, further comprising:
a first solder ball disposed on the first bond site and projecting away from the first bond site by a first distance; and
a second solder ball disposed on the second bond site and projecting away from the second bond site by a second distance at least approximately the same as the first distance.

44. A microelectronic assembly, comprising:
a microelectronic substrate;
a support substrate having a first surface carrying the microelectronic substrate and a second surface facing opposite from the first surface; and
a connection structure disposed on the second surface of the support substrate, the connection structure having a bond site configured to receive a flowable conductive material, the connection structure further having at least two elongated members connected to and extending outwardly from the bond site with none of the elongated members being electrically coupled to the microelectronic substrate.

45. The assembly of claim 44 wherein each elongated member is configured to receive at least a portion of the flowable conductive material from the bond site.

46. The assembly of claim 44 wherein the connection structure is a first connection structure and the elongated members are first elongated members configured to receive at least a portion of a flowable conductive material from the first bond site, and wherein the apparatus further comprises a second connection structure carried by the support substrate, the second connection structure having a second bond site configured to receive a flowable conductive material, the second connection structure being electrically coupled to the microelectronic substrate and having second elongated members extending outwardly from the second bond site, wherein each of the second elongated members is configured to receive at least a portion of the flowable conductive material from the second bond site.

47. The assembly of claim 44 wherein the connection structure is a first connection structure and the elongated members are first elongated members, and wherein the apparatus further comprises a second connection structure carried by the support substrate, the second connection structure having a second bond site configured to receive a flowable conductive material, the second connection structure having a third bond site electrically coupled to the microelectronic substrate, the second connection structure further having second elongated members extending outwardly from the second bond site, wherein each of the second elongated members is configured to receive at least a portion of the flowable conductive material from the second bond site, and wherein at least one of the second elongated members extends between the second and third bond sites.

48. The assembly of claim 44 wherein the elongated members are configured to be wetted by the flowable conductive material when the flowable conductive material is in a flowable state.

49. The assembly of claim 44 wherein the conductive structure includes exactly two elongated members extending away from opposite sides of the bond site.

50. The assembly of claim 44, further comprising a layer disposed on the elongated members and attached to the support substrate, the layer having an aperture aligned with the bond site.

51. The assembly of claim 44, further comprising a layer disposed on the elongated members and attached to the support substrate, the layer having an aperture aligned with the bond site, and wherein a covered portion of each elongated member extends between the layer and the support substrate, and an exposed portion of each elongated member is exposed through the aperture, further wherein each exposed portion has approximately the same length.

52. The assembly of claim 44 wherein the connection structure includes at least one electrically conductive metallic material.

53. The assembly of claim 44 wherein the bond site includes a solder ball pad, and wherein the apparatus further comprises a solder ball disposed on the solder ball pad.

54. The assembly of claim 44 wherein at least one of the elongated members has a first end connected to the bond site and a second end spaced apart from the bond site, and wherein the at least one elongated member includes an anchor toward the second end to secure the at least one elongated member to the support substrate.

55. The assembly of claim 44 wherein the support substrate includes a slot extending between the first and second surfaces, and wherein the apparatus further comprises wires extending through the slot between the second connection structure and the microelectronic substrate.

56. The assembly of claim 44 wherein the connection structure is a first connection structure and the elongated members are first elongated members configured to receive at least a portion of a flowable material from the first bond site, and wherein the apparatus further comprises a second connection structure carried by the support substrate, the second connection structure having a second bond site configured to receive a flowable conductive material, the second connection structure being electrically coupled to the microelectronic substrate and having second elongated members extending outwardly from the second bond site, wherein each of the second elongated members is configured to receive at least a portion of the flowable conductive material from the second bond site, and wherein the apparatus further comprises:

a first solder ball disposed on the first bond site and projecting away from the first bond site by a first distance; and a second solder ball disposed on the second bond site and projecting away from the second bond site by a second distance at least approximately the same as the first distance.

57. A microelectronic assembly, comprising:

a microelectronic substrate;

a support substrate having a first surface carrying the microelectronic substrate and a second surface facing opposite from the first surface;

an inactive connection structure disposed on the second surface of the support substrate, the inactive connection structure having a first bond pad in contact with a first solder ball, the inactive connection structure further having at least two first elongated conductive members, each of which extends outwardly from the first bond pad and neither of which is electrically coupled to the microelectronic substrate, the first conductive members each contacting at least a portion of the first solder ball;

an active connection structure disposed on the second surface of the support substrate, the active connection structure having a second bond pad in contact with a second solder ball, the active connection structure further having a third bond pad configured to receive a wire bond, the active connection structure still further having at least two second elongated conductive members each extending outwardly from the second bond pad, wherein at least one of the second conductive members extends between the second bond pad and the third bond pad, and wherein each of the second conductive members contacts at least a portion of the second solder ball;

a wire bond connected between the microelectronic substrate and the third bond pad; and a solder mask disposed on the active and inactive connection structures, the solder mask having a first aperture aligned with the first bond pad and a second aperture aligned with the second bond pad.

58. The assembly of claim 57 wherein the first bond pad has a diameter of about 330 microns and wherein each of the first conductive members has a length of about 250 microns or more, further wherein a covered portion of each of the first conductive members extends beneath the solder mask for a distance of about 200 microns.

59. The assembly of claim 57 wherein the inactive connection structure and the active connection structure each have the same number of conductive members.

60. The assembly of claim 57 wherein at least one of the first elongated conductive members has a first end connected to the first bond pad and a second end spaced apart from the first bond pad, and wherein the at least one first elongated conductive member includes an anchor toward the second end to secure the at least one first elongated conductive member to the support substrate.

61. The assembly of claim 57, further comprising:

a first solder ball disposed on the first bond site and projecting away from the first bond site by a first distance; and a second solder ball disposed on the second bond site and projecting away from the second bond site by a second distance at least approximately the same as the first distance.

* * * * *